(12) United States Patent
Bedell et al.

(10) Patent No.: US 8,802,477 B2
(45) Date of Patent: Aug. 12, 2014

(54) HETEROJUNCTION III-V PHOTOVOLTAIC CELL FABRICATION

(75) Inventors: Stephen W. Bedell, Yorktown Heights, NY (US); Norma Sosa Cortes, Yorktown Heights, NY (US); Keith E. Fogel, Yorktown Heights, NY (US); Devendra Sadana, Yorktown Heights, NY (US); Ghavam Shahidi, Yorktown Heights, NY (US); Davood Shahrjerdi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 802 days.

(21) Appl. No.: 12/713,584

(22) Filed: Feb. 26, 2010

(65) Prior Publication Data

US 2010/0307572 A1 Dec. 9, 2010

Related U.S. Application Data

(60) Provisional application No. 61/185,247, filed on Jun. 9, 2009.

(51) Int. Cl.
| | |
|---|---|
| H01L 21/00 | (2006.01) |
| H01L 21/30 | (2006.01) |
| H01L 21/46 | (2006.01) |
| H01L 21/762 | (2006.01) |
| H01L 21/20 | (2006.01) |
| H01L 31/0304 | (2006.01) |

(52) U.S. Cl.
CPC .......... *H01L 21/76254* (2013.01); *H01L 21/20* (2013.01)
USPC ...................... 438/57; 438/458; 257/E31.019

(58) Field of Classification Search
None
See application file for complete search history.

(56) References Cited

U.S. PATENT DOCUMENTS

| 2,274,112 A | 2/1942 | Wesley et al. |
| 4,133,724 A | 1/1979 | Hartnagel et al. |

(Continued)

FOREIGN PATENT DOCUMENTS

| JP | 2009141135 | 6/2009 |
| JP | 2009532918 A | 9/2009 |

(Continued)

OTHER PUBLICATIONS

International Search Report and Written Opinion of the International Searching Authority; International Application No. PCT/US2011/024949; International Filing Date: Feb. 16, 201; Date of Mailing: Oct. 27, 2011; 8 pages.

(Continued)

*Primary Examiner* — Calvin Choi
(74) *Attorney, Agent, or Firm* — Cantor Colburn LLP; Vazken Alexanian (57) ABSTRACT

A method for forming a heterojunction III-V photovoltaic (PV) cell includes performing layer transfer of a base layer from a wafer of a III-V substrate, the base layer being less than about 20 microns thick; forming an intrinsic layer on the base layer; forming an amorphous silicon layer on the intrinsic layer; and forming a transparent conducting oxide layer on the amorphous silicon layer. A heterojunction III-V photovoltaic (PV) cell includes a base layer comprising a III-V substrate, the base layer being less than about 20 microns thick; an intrinsic layer located on the base layer; an amorphous silicon layer located on the intrinsic layer; and a transparent conducting oxide layer located on the amorphous silicon layer.

9 Claims, 8 Drawing Sheets

(56) References Cited

U.S. PATENT DOCUMENTS

| | | |
|---|---|---|
| 4,244,348 A | 1/1981 | Wilkes |
| 4,331,703 A | 5/1982 | Lindmayer |
| 4,590,095 A | 5/1986 | Park |
| 4,710,589 A | 12/1987 | Meyers et al. |
| 4,805,003 A | 2/1989 | Holm et al. |
| 4,997,793 A | 3/1991 | McClurg |
| 5,272,114 A | 12/1993 | van Berkum et al. |
| 5,350,459 A | 9/1994 | Suzuki et al. |
| 5,668,060 A | 9/1997 | Sato et al. |
| 5,854,123 A | 12/1998 | Sato et al. |
| 5,882,987 A | 3/1999 | Srikrishnan |
| 5,902,505 A | 5/1999 | Finley |
| 6,033,974 A | 3/2000 | Henley et al. |
| 6,040,520 A | 3/2000 | Morooka et al. |
| 6,238,539 B1 | 5/2001 | Joyce et al. |
| 6,500,732 B1 | 12/2002 | Henley et al. |
| 6,517,632 B2 | 2/2003 | Minami et al. |
| 6,612,590 B2 | 9/2003 | Coomer et al. |
| 6,794,276 B2 | 9/2004 | Letertre et al. |
| 6,808,952 B1 | 10/2004 | Sniegowski et al. |
| 6,809,009 B2 | 10/2004 | Aspar et al. |
| 6,846,698 B2 | 1/2005 | O'Keefe et al. |
| 6,869,266 B2 | 3/2005 | Coomer et al. |
| 6,951,819 B2 * | 10/2005 | Iles et al. ............... 438/705 |
| 6,989,575 B2 | 1/2006 | Gates et al. |
| 7,022,585 B2 | 4/2006 | Solanki et al. |
| 7,056,808 B2 | 6/2006 | Henley et al. |
| 7,341,927 B2 | 3/2008 | Atwater, Jr. et al. |
| 7,427,554 B2 | 9/2008 | Henley et al. |
| 7,436,066 B2 | 10/2008 | Sonobe et al. |
| 7,487,684 B2 | 2/2009 | Gupta et al. |
| 7,488,890 B2 | 2/2009 | Takamoto et al. |
| 8,124,499 B2 | 2/2012 | Henley et al. |
| 2002/0094260 A1 | 7/2002 | Coomer et al. |
| 2002/0195137 A1 | 12/2002 | King et al. |
| 2003/0198547 A1 | 10/2003 | Coomer et al. |
| 2004/0235268 A1 | 11/2004 | Letertre et al. |
| 2004/0261837 A1 | 12/2004 | Friedman et al. |
| 2005/0072461 A1 | 4/2005 | Kuchinski et al. |
| 2005/0268963 A1 * | 12/2005 | Jordan et al. ............. 136/256 |
| 2006/0076559 A1 | 4/2006 | Faure et al. |
| 2006/0112986 A1 | 6/2006 | Atwater, Jr. et al. |
| 2006/0144435 A1 | 7/2006 | Wanlass |
| 2006/0162768 A1 | 7/2006 | Wanlass et al. |
| 2006/0207648 A1 | 9/2006 | Shima et al. |
| 2006/0260932 A1 | 11/2006 | Ravkin et al. |
| 2007/0012353 A1 | 1/2007 | Fischer et al. |
| 2007/0023777 A1 | 2/2007 | Sonobe et al. |
| 2007/0029043 A1 | 2/2007 | Henley |
| 2007/0037323 A1 | 2/2007 | Henley et al. |
| 2007/0039395 A1 | 2/2007 | Gupta et al. |
| 2007/0166974 A1 | 7/2007 | Uchino et al. |
| 2007/0235074 A1 | 10/2007 | Henley et al. |
| 2007/0249140 A1 * | 10/2007 | Dross et al. ............. 438/458 |
| 2007/0269960 A1 | 11/2007 | Letertre et al. |
| 2007/0277873 A1 | 12/2007 | Cornfeld et al. |
| 2007/0295973 A1 | 12/2007 | Jinbo et al. |
| 2007/0298238 A1 * | 12/2007 | Witvrouw et al. ......... 428/304.4 |
| 2008/0012121 A1 | 1/2008 | Hara et al. |
| 2008/0110489 A1 | 5/2008 | Sepehry-Fard |
| 2008/0132047 A1 | 6/2008 | Dunne et al. |
| 2008/0210563 A1 | 9/2008 | Zhang et al. |
| 2008/0241986 A1 * | 10/2008 | Rohatgi et al. ............. 438/72 |
| 2008/0245409 A1 | 10/2008 | Varghese et al. |
| 2008/0268622 A1 | 10/2008 | Van Gestel |
| 2009/0038678 A1 | 2/2009 | Pan et al. |
| 2009/0117679 A1 | 5/2009 | Fritzemeier |
| 2009/0211623 A1 * | 8/2009 | Meier et al. ............. 136/246 |
| 2009/0277314 A1 | 11/2009 | Henley |
| 2009/0280635 A1 | 11/2009 | Mathew et al. |
| 2010/0015750 A1 | 1/2010 | Shen et al. |
| 2010/0112195 A1 | 5/2010 | Kodas et al. |
| 2010/0307572 A1 | 12/2010 | Bedell et al. |
| 2010/0307591 A1 | 12/2010 | Bedell et al. |
| 2010/0310775 A1 | 12/2010 | Bedell et al. |
| 2011/0048516 A1 | 3/2011 | Bedell et al. |
| 2011/0048517 A1 | 3/2011 | Bedell et al. |

FOREIGN PATENT DOCUMENTS

| | | |
|---|---|---|
| KR | 2009025257 A | 3/2009 |
| WO | WO2009061353 A2 | 5/2009 |
| WO | WO2009098109 A1 | 8/2009 |
| WO | WO2009151979 A2 | 12/2009 |
| WO | WO2010072675 A2 | 7/2010 |

OTHER PUBLICATIONS

Notification Concerning Transmittal of International Preliminary Report on Patentability dated Dec. 22, 2011; International Application No. PCT/US2010/034161; International Filing Date: May 10, 2010; 1 page.

Notification Concerning Transmittal of International Preliminary Report on Patentability dated Dec. 22, 2011; International Application No. PCT/US2010/37029; International Filing Date: Jun. 2, 2010; 1 page.

International Preliminary Report on Patentability; Written Opinion of the International Searching Authority; International Application No. PCT/US2010/034161; International Filing Date: May 10, 2010; 8 pages.

International Preliminary Report on Patentability; Written Opinion of the International Searching Authority; International Application No. PCT/US2010/37029; International Filing Date: Jun. 2, 2010; 7 pages.

International Search Report and Written Opinion for International Application No. PCT/US2010/034161 Filed May 10, 2010.

International Search Report and Written Opinion for International Application No. PCT/US2010/037029 Filed Jun. 2, 2010.

F. Dross et al., "Stress-induced large-area lift-off of crystalline Si films" Applied Physics A; Materials Science & Processing, Springer, Berlin, DE, vol. 89, No. 1, Jul. 5, 2007, pp. 149-152.

D. Law, et al., "Lightweight, Flexible, High-Efficiency III-V Multijunction Cells"; This paper appears in: Photvoltaic Energy Conversion, Conference Record of the 20006 IEEE, 4th World Conference on May 2006; pp. 1879-1882.

International Search Report and Written Opinion; International Application No. PCT/EP2011/051545; International Filing Date: Feb. 3, 2011; 14 pages.

Y. Tsunomura et al., 22%-Efficiency HIT Solar cell, Technical Digest of the International PVSEC-17, 2007, pp. 387-390, Fukuoka.

U.S. Appl. No. 61/185,247, filed Jun. 6, 2009.

M. Brede et al., Brittle crack propagation in silicon single crystals, Journal of Applied Physics, 1991, pp. 758-771, 70 (2), American Institute of Physics.

K. Wasmer et al., Cleavage Fracture of Brittle Semiconductors from the Nanometer to the Centimeter Scale, Advanced Engineering Materials, 2005, pp. 309-317, vol. 7, No. 5.

M.V. Sullivan et al., Electroless Nickel Plating for Making Ohmic Contacts to Silicon, Journal of the Electrochemical Society, 1957, pp. 226-230, vol. 104, No. 4.

J.J. Schermer et al., Epitaxial Lift-Off for large area thin film III/V devices, Phys. Stat. Sol., 2005, pp. 501-508, (a) 202, No. 4.

C. Scheck et al., Evolution of interface properites of electrodeposited Ni/GaAs(001) contacts upon annealing, Journal of Applied Physics, 2004, pp. 6549-6551, vol. 95, No. 11, American Institute of Physics.

Bedell et al., US Nonprovisional Patent Application entitled, Spalling for a Semiconductor Substrate, U.S. Appl. No. 12/713,560, filed Feb. 26, 2010.

Bedell et al., US Nonprovisional Patent Application entitled, Single-Junction Photovoltaic Cell, U.S. Appl. No. 12/713,572, filed Feb. 26, 2010.

T. Hjort et al., Gallium arsenide as a mechanical material, J. Micromech. Microeng., 1994, pp. 1-13, 4.

M. Konagai et al., High Efficiency GaAs thin film solar cells by peeled firm technology, Journal of Crystal Growth, 1978, pp. 277-280, 45, North-Holland Publishing Company.

(56) References Cited

OTHER PUBLICATIONS

J. F. Geisz et al., High-efficiency GaInP/GaAs/InGaAs triple-junction solar cells grown inverted with a metamorphic bottom junction, Applied Physics, 2007, 023502, 91, American Institute of Physics.

H. Yamaguchi et al., Investigation of Non-Ohmic Properties for Thin Film InGaP/GaAs Solar Cells, IEEE 4th World Conf on Photovoltaic Energy Conv, May 2006, pp. 1805-1807, vol. 2, IEEE.

M. Wanlass et al., Monolithic, Ultra-Thin, GaInP/GaAs/GaInAs Tandem Solar Cells, IEEE 4th World Conference on Photovoltaic Energy Conv, May 2006, pp. 729-732, vol. 2, IEEE.

K. Bock et al., New Manufacturing Concepts for Ultra-Thin Silicon and Gallium Arsenide Substrates, International Conf. on Compound Semiconductor Mfg., 2003, GaAsMANTECH Inc.

V.P. Ganesh et al., Overview and Emerging Challenges in Mechanical Dicing of Silicon Wafers, Electronics Packaging Technology Conference, Dec. 2006, pp. 15-21, EPTC.

F. Dross et al., Stress-induced large-area lift-off of crystalline Si films, Applied Phsyics, 2007, pp. 149-152, A 89.

Z.M. Zhou et al., The evaluation of Young's modulus and residual stress of nickel films by microbridge testings, Measurement Science and Technology, 2004, pp. 2389-2394, vol. 15, IOP Publishing.

K.J. Weber, Transfer of monocrystalline Si films for thin film solar cells, 2004, Austrailian National University.

M.R. Page et al., Well Passivated a-Si:H Back Contacts for Double-Heterojunction Silicon Solar Cells, IEEE 4th World Conf on Photovoltaic Energy Conv, May 2006, pp. 1485-1488, vol. 2, IEEE.

US Provisional Patent Application filed Jun. 9, 2009. U.S. Appl. No. 61/185,247.

Bedell, et al., US Nonprovisional Patent Application entitled, Multijunction Photovoltaic Cell Fabrication, U.S. Appl. No. 12/713,592, filed Feb. 26, 2010.

Bedell et al., US Nonprovisional Patent Application entitled, Multijunction Cell Fabrication, U.S. Appl. No. 12/713,581, filed Feb. 26, 2010.

* cited by examiner

```
┌─────────────────────────────────────────────────────────────────────────┐
│ FORM INTRINSIC LAYER, BACK SURFACE FIELD, AND AMORPHOUS SILICON LAYER ON │
│                              SUBSTRATE                                   │
│                                501                                       │
└─────────────────────────────────────────────────────────────────────────┘
```

```
┌─────────────────────────────────────────────────────────────────────────┐
│ FORM TENSILE STRESSED METAL LAYER OVER AMORPHOUS SILICON LAYER; ADHERE   │
│                     FLEXIBLE SUBSTRATE TO METAL LAYER                    │
│                                502                                       │
└─────────────────────────────────────────────────────────────────────────┘
```

```
┌─────────────────────────────────────────────────────────────────────────┐
│ SPALL BASE LAYER, INTRINSIC LAYER, BACK SURFACE FIELD, AND AMORPHOUS     │
│ SILICON LAYER FROM SUBSTRATE USING FLEXIBLE SUBSTRATE AND TENSILE        │
│                           STRESSED METAL LAYER                           │
│                                  503                                     │
└─────────────────────────────────────────────────────────────────────────┘
```

```
┌─────────────────────────────────────────────────────────────────────────┐
│                  REMOVE FLEXIBLE SUBSTRATE FROM METAL LAYER              │
│                                  504                                     │
└─────────────────────────────────────────────────────────────────────────┘
```

```
┌─────────────────────────────────────────────────────────────────────────┐
│ FORM INTRINSIC LAYER, AMORPHOUS SILICON LAYER, AND TRANSPARENT CONDUCTING│
│                      OXIDE LAYER OVER BASE LAYER                         │
│                                  505                                     │
└─────────────────────────────────────────────────────────────────────────┘
```

HETEROJUNCTION III-V PHOTOVOLTAIC CELL FABRICATION

CROSS-REFERENCE TO RELATED APPLICATION

This application claims the benefit of U.S. Provisional Application No. 61/185,247, filed Jun. 9, 2009. This application is also related to U.S. Ser. Nos. 12/713,592, 12/713,581, 12/713,560, and 12/713,572, each assigned to International Business Machines Corporation (IBM) and filed on the same day as the instant application, all of which are herein incorporated by reference in their entirety.

FIELD

This disclosure relates generally to the field of heterojunction photovoltaic cell fabrication.

DESCRIPTION OF RELATED ART

Silicon (Si) based heterojunction intrinsic thin layer (HIT) photovoltaic (PV) cells may comprise a bulk single-crystalline silicon (sc-Si) base layer sandwiched between two layers of amorphous Si (a-Si). The use of a-Si layers in an HIT cell gives the HIT cell a wider bandgap than a cell comprising only sc-Si. The a-Si layer also creates an energy barrier at the interface between the a-Si and the sc-Si base layer, which keeps minority carriers away from the interface, thereby reducing the recombination rate in the cell. Additionally, a-Si may be processed at a relatively low temperature. The HIT cell structure may have a sc-Si substrate thickness in the range of a few tens of microns (μm). This substrate thickness is smaller than the diffusion length of the minority carriers in the PV cell, while being sufficiently thick to allow maximum absorption of the solar spectrum.

SUMMARY

In one aspect, a method for forming a heterojunction III-V photovoltaic (PV) cell includes performing layer transfer of a base layer from a wafer of a III-V substrate, the base layer being less than about 20 microns thick; forming an intrinsic layer on the base layer; forming an amorphous silicon layer on the intrinsic layer; and forming a transparent conducting oxide layer on the amorphous silicon layer.

In one aspect, a heterojunction III-V photovoltaic (PV) cell includes a base layer comprising a III-V substrate, the base layer being less than about 20 microns thick; an intrinsic layer located on the base layer; an amorphous silicon layer located on the intrinsic layer; and a transparent conducting oxide layer located on the amorphous silicon layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for heterojunction (HJ) III-V PV cell fabrication are provided, with exemplary embodiments being discussed below in detail. An HJ solar cell may be formed using a base layer comprising a III-V based substrate, such as germanium (Ge) or gallium arsenide (GaAs), in place of sc-Si. In a III-V based substrate, the diffusion length of the minority carriers is relatively small in comparison to the substrate thickness. Due to its direct band gap, a relatively thin layer (a few microns thick) of a III-V based substrate is capable of effectively absorbing a large portion of the solar spectrum, unlike sc-Si. An HJ III-V PV cell structure comprises a base layer comprising a III-V substrate that is less than about 20 μm thick in some embodiments. Deposition of a-Si on one side of the base layer forms a single HJ cell, and deposition of a-Si on both sides of the base layer forms a double HJ cell. An HJ III-V PV cell may be relatively lightweight and/or flexible, allowing use of the HJ III-V PV cell in diverse applications.

The formation of the relatively thin base layer of the III-V base substrate may be achieved by any appropriate layer transfer method including smart cut layer transfer, epitaxial layer transfer, or spalling. Smart cut layer transfer is appropriate for formation of a base layer for a single HJ cell. Smart cut layer transfer comprises hydrogen (H) implantation into the III-V substrate, followed by an annealing in order to initiate cracks within the H-implanted region that then travel into the substrate. However, smart cut layer transfer has some limitations for producing layers thicker than couple of microns. Smart cut layer transfer requires for relatively high implantation energies, which tend to be costly. In addition, the use of high implantation energy may result in implantation damage within the thin film, resulting in degradation of the crystalline quality of the film, which severely degrades cell performance. Smart cut layer transfer is not suitable for double HJ cells, as the a-Si layer formed on the substrate prior to layer transfer cannot withstand the relatively high annealing temperature. Epitaxial layer transfer is appropriate for formation of both single and double HJ cells, and comprises growth of a sacrificial layer below the base layer in the substrate. The sacrificial layer is removed using a wet chemical etch, in order to release the relatively thin base layer from the substrate. Lastly, spalling offers a relatively inexpensive, low-temperature method for separation of a relatively thin base layer from a substrate. The low-temperature nature of spalling allows use in fabrication of both single and double HJ III-V cells.

Figure 1:
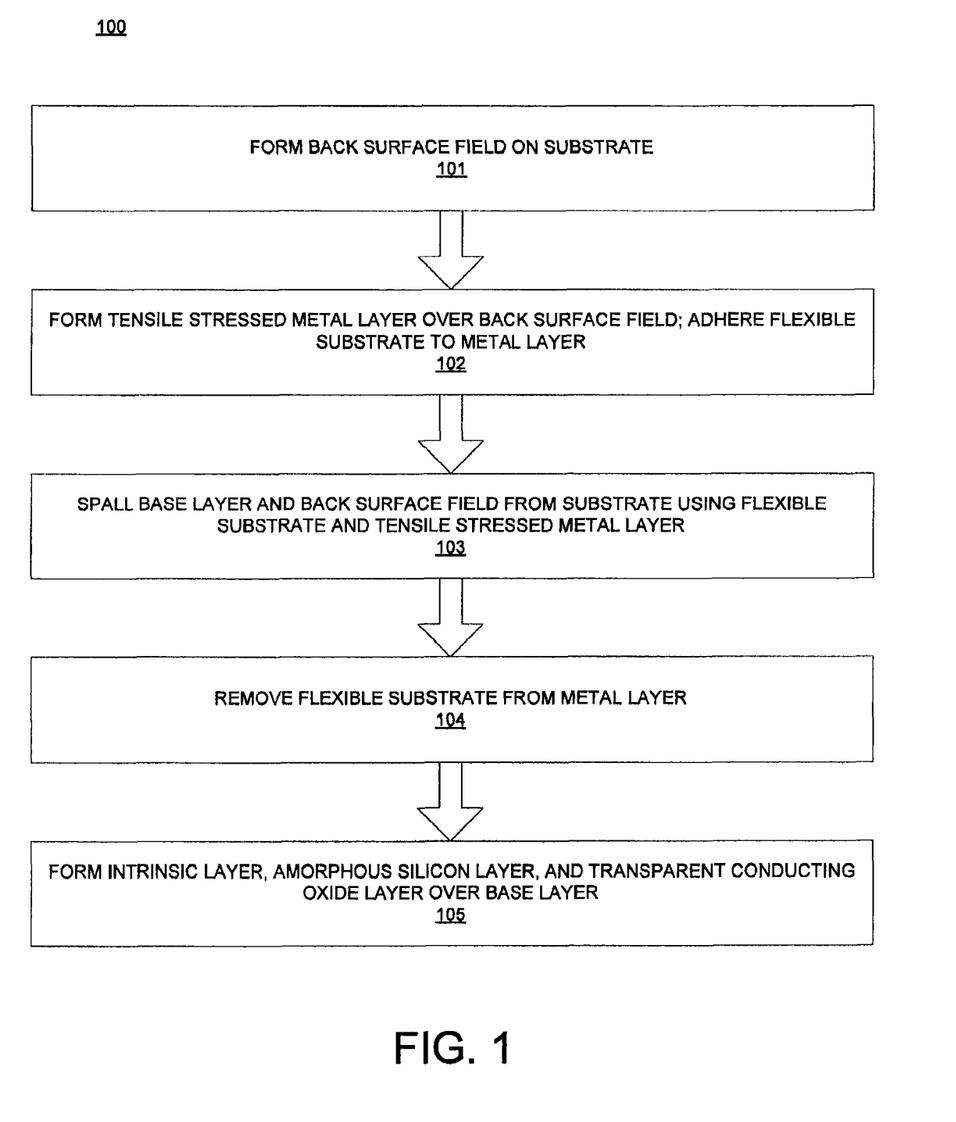
FIG. 1 illustrates an embodiment of a method of forming a single heterojunction III-V PV cell via spalling.
Figure 2:
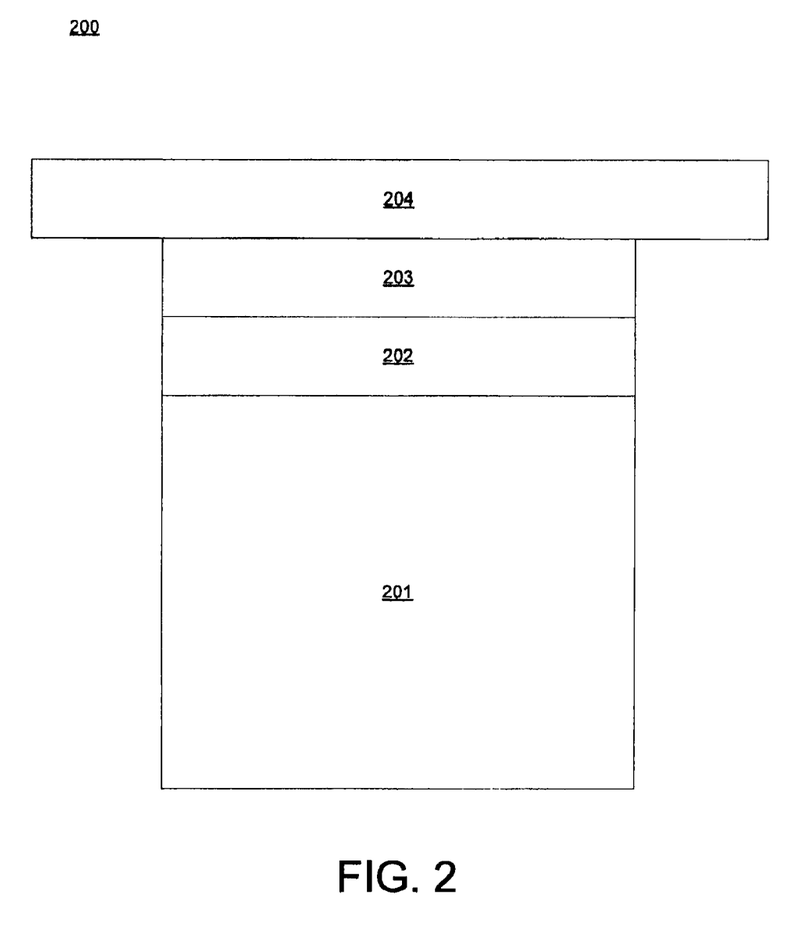
FIG. 2 illustrates an embodiment of a substrate having a back surface field, metal layer, and a flexible substrate layer.

FIG. 1 illustrates an embodiment of a method 100 of forming a single HJ III-V PV cell via spalling. FIG. 1 is discussed with reference to FIGS. 2-4. In block 101, a optional back surface field (BSF) 202 is formed on a wafer of a III-V substrate 201, as shown in FIG. 2. Substrate 201 may comprise germanium (Ge) and/or gallium arsenide (GaAs) in some embodiments. Substrate 201 may comprise an n-type or a p-type substrate. The optional BSF 202 may be formed by depositing a layer of a dopant on the substrate 201, and diffusing the dopant into the substrate 201 in some embodiments, or the optional BSF 202 may comprise a localized back contact. The dopant used to form optional BSF 202 may comprise zinc (Zn), indium (In), or aluminum (Al) in some embodiments. Optional BSF 202 may alternately comprise another material that deposited directly on the substrate 201; the BSF material may have a wider band gap than that of the substrate 201. Some examples of an appropriate BSF material may comprise InGaP (for a Ge substrate), or AlGaAs (for a GaAs substrate).

In block 102, a tensile stressed metal layer 203 is formed, and a flexible substrate layer 204 is adhered to the metal layer 203, as shown in FIG. 2. In embodiments that do not comprise optional BSF 202, metal layer 203 is formed directly on substrate 201. Metal layer 203 may comprise nickel (Ni) in some embodiments. Flexible substrate layer 204 may comprise a flexible adhesive, which may be water-soluble in some embodiments. Use of a rigid material for the flexible substrate layer 204 may render the spalling mode of fracture unworkable. Therefore, flexible substrate layer 204 may further comprise a material having a radius of curvature of less than 5 meters in some embodiments, and less than 1 meter in some exemplary embodiments.

Figure 3:
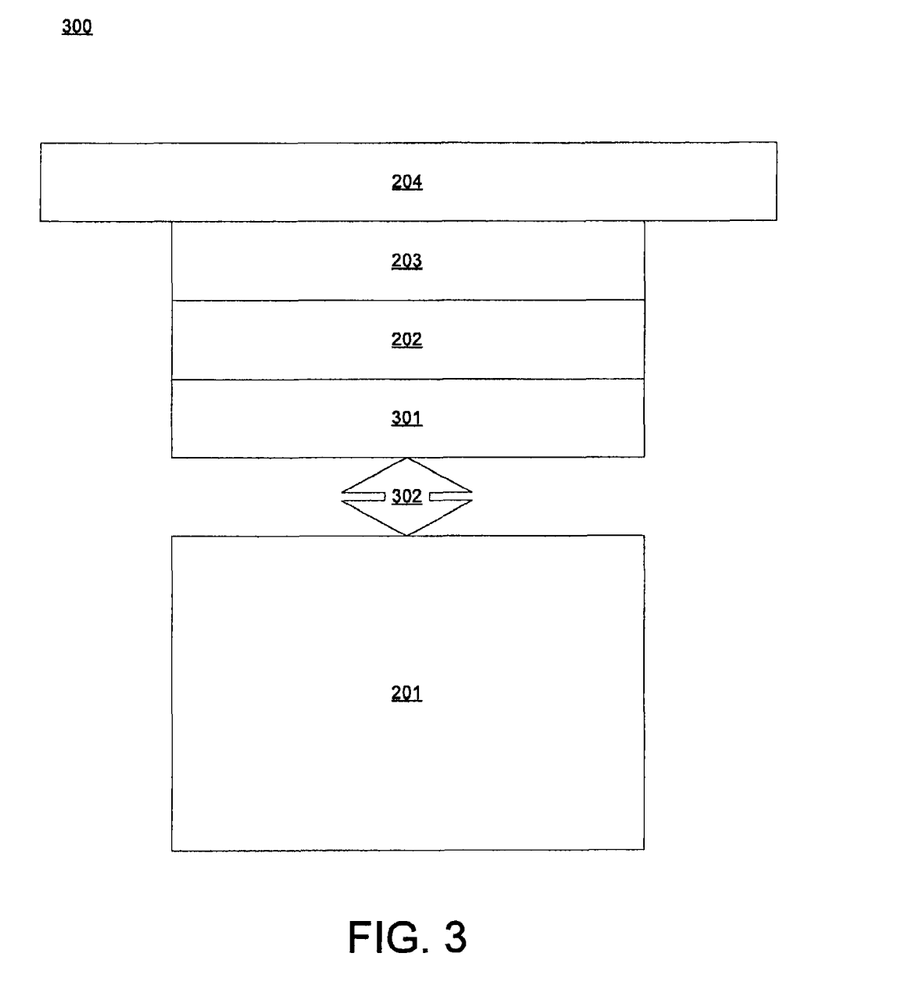
FIG. 3 illustrates an embodiment of spalling using a flexible substrate layer.

In block 103, base layer 301 is spalled from substrate 201, as shown in FIG. 3. The flexible substrate 204 is used to cause the tensile stress in metal layer 203 to form fracture 302 in substrate 201, separating base layer 301 from substrate 201. Base layer 301 comprises the same material as substrate 201, and may be less than about 20 μm thick in some embodiments. The thickness of the base layer 301 is determined by the tensile stress and thickness of metal layer 203. In embodiments comprising optional BSF 202, optional BSF 202 is spalled from substrate 201 along with base layer 301. In block 104, flexible substrate layer 204 is removed from metal layer 203.

Figure 4:
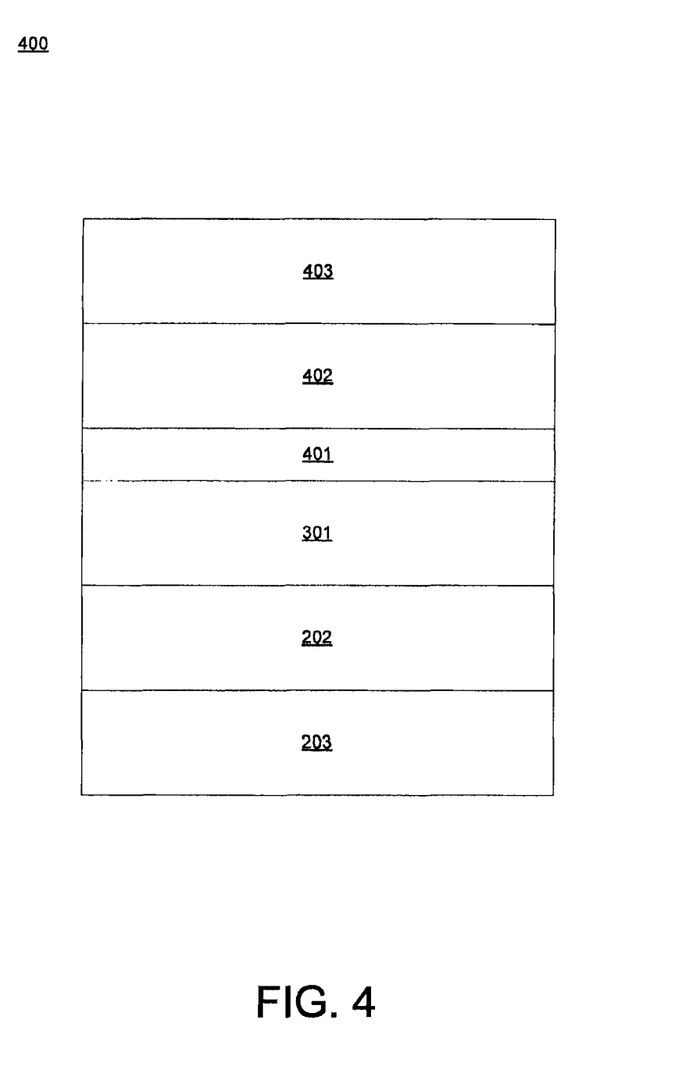
FIG. 4 illustrates an embodiment of a single heterojunction III-V PV cell.

In block 105, a single HJ III-V PV cell 400 is formed using base layer 301, as shown in FIG. 4. Single HJ III-V cell 400 comprises optional BSF 202; however, in some embodiments, base layer 301 may be located directly on metal layer 203, and optional BSF 202 may be absent. Metal layer 203 may comprise a back contact for the single HJ II-IV cell 400. Intrinsic layer 401 is formed on base layer 301, a-Si layer 402 is formed on intrinsic layer 401, and transparent conducting oxide (TCO) layer 403 is formed on amorphous silicon layer 402. The a-Si layer 402 may have a doping type (n-type or p-type) that is opposite the doping type of substrate 201; in such an embodiment, the a-Si layer 402 is configured to act as an emitter for the HJ III-V cell 400. In some embodiments, an a-Si layer 402 configured to act as an emitter may be formed on subtrate 201 or BSF 202 before spalling instead of after spalling. TCO layer 403 may comprise zinc oxide (ZnO) doped with aluminum (Al) in some embodiments. Finger or bus bars (not shown) may be formed on TCO layer 403 in some embodiments.

While some embodiments of single HJ III-V PV cell 400 may comprise a base layer 301 formed by spalling, other embodiments of cell 400 may comprise a base layer 301 formed by smart cut or epitaxial layer transfer. In embodiments using smart cut or epitaxial layer transfer methods, BSF 202 and/or a-Si layer 402 configured to act as an emitter may optionally be formed on substrate 201, then either smart cut or epitaxial layer transfer are used to separate the base layer 301 from the substrate 201. A single HJ III-V cell 400 may then be formed using base layer 301 in the same manner discussed above with respect to block 105.

Figure 5:
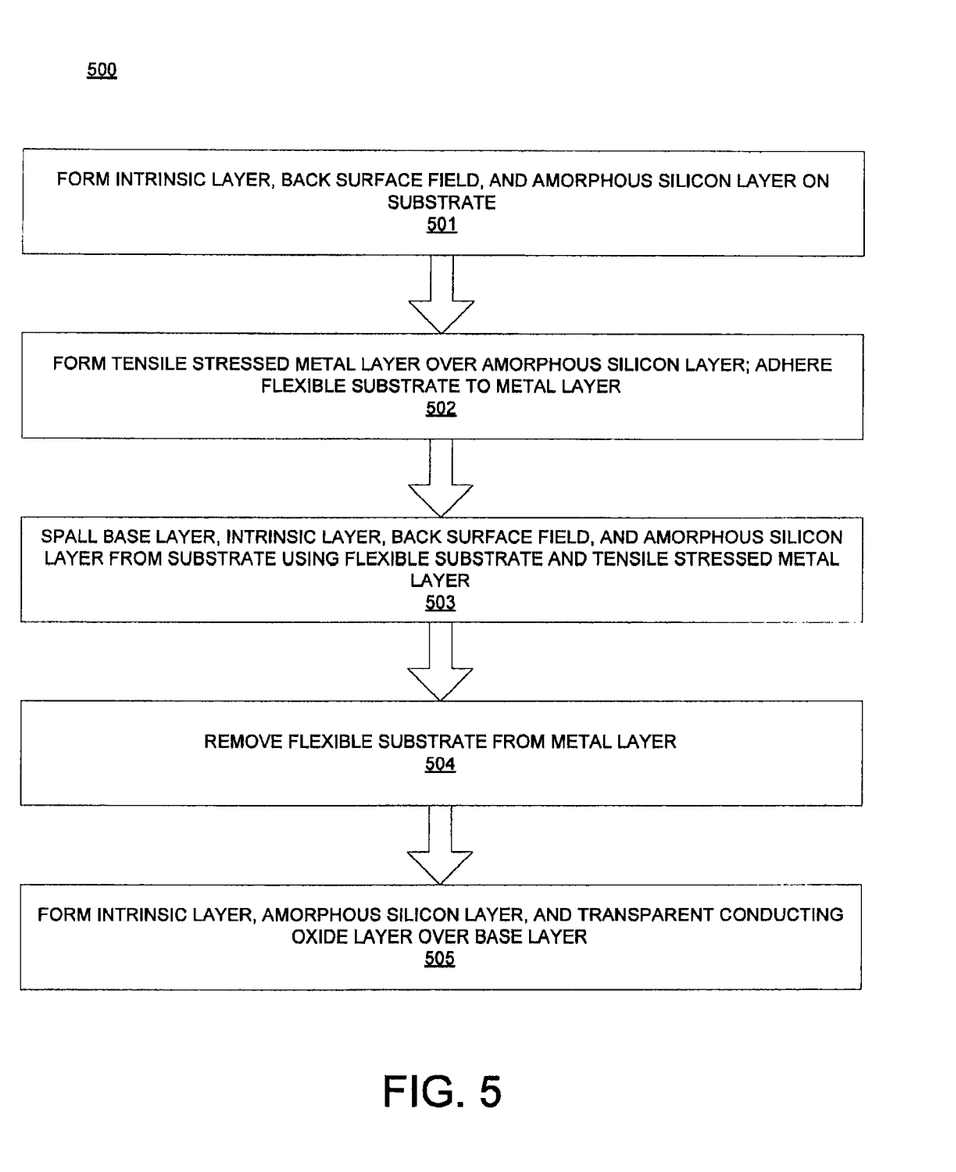
FIG. 5 illustrates an embodiment of a method of forming a double heterojunction III-V cell via spalling.
Figure 6:
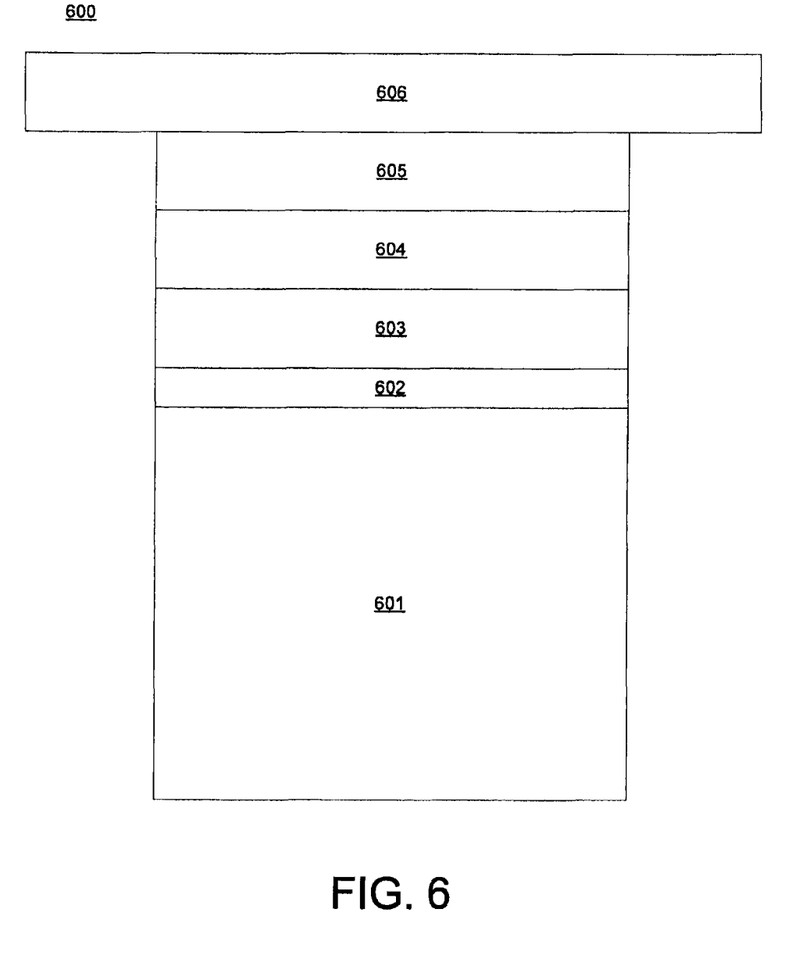
FIG. 6 illustrates an embodiment of a substrate having an intrinsic layer, a back surface field, an amorphous silicon layer, a metal layer, and a flexible substrate layer.

FIG. 5 illustrates an embodiment of a method 500 of forming a double HJ III-V PV cell via spalling. FIG. 5 is discussed with reference to FIGS. 6-8. In block 501, an intrinsic layer 602 is formed in a wafer of a III-V substrate 201, as shown in FIG. 6. Substrate 601 may comprise Ge and/or GaAs in some embodiments. Substrate 601 may comprise an n-type or a p-type substrate. An optional BSF 603 may be formed on intrinsic layer 602 in some embodiments. Optional BSF 603 may comprise a material having a wider band gap than that of the substrate 601. Some examples of an appropriate BSF material may comprise InGaP (for a Ge substrate) or AlGaAs (for a GaAs substrate). An a-Si layer 604 is then formed on intrinsic layer 602 in embodiments not comprising optional BSF 603; in such embodiments, a-Si layer 604 and intrinsic layer 602 may function together as a back surface field. In embodiments comprising optional BSF 603, a-Si layer 604 is formed on optional BSF 603. The a-Si layer 604 may comprise a doping type (n-type or p-type) that is the same as that of substrate 601; in such an embodiment, the a-Si layer 604 may act as a BSF. The a-Si layer 604 may alternately comprise a doping type that is opposite that of substrate 601; in such an embodiment, a-Si layer 604 may act as an emitter.

In block 502, a tensile stressed metal layer 605 is formed on a-Si layer 604, and a flexible substrate layer 606 is adhered to the metal layer 605, as shown in FIG. 6. Metal layer 605 may comprise nickel (Ni) in some embodiments. Flexible substrate layer 606 may comprise a flexible adhesive, which may be water-soluble in some embodiments. Use of a rigid material for the flexible substrate layer 606 may render the spalling mode of fracture unworkable. Therefore, flexible substrate layer 606 may further comprise a material having a radius of curvature of less than 5 meters in some embodiments, and less than 1 meter in some exemplary embodiments.

Figure 7:
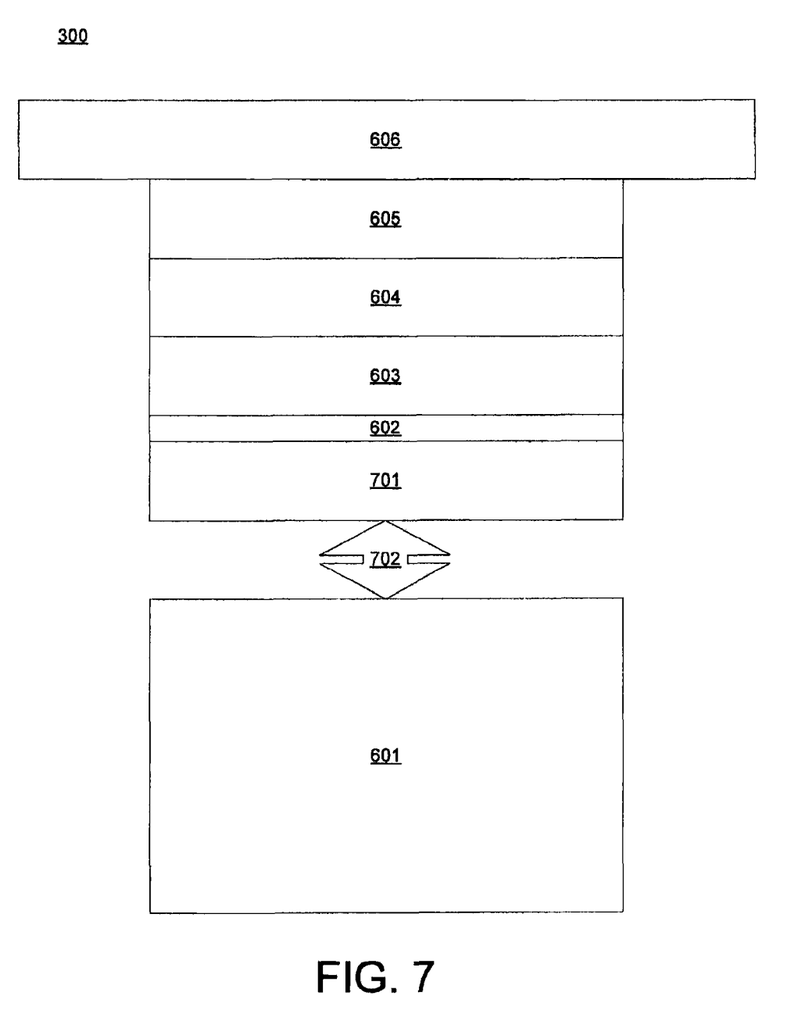
FIG. 7 illustrates an embodiment of spalling using a flexible substrate layer.

In block 503, a base layer 701 is spalled from substrate 601, as shown in FIG. 7. The flexible substrate 606 is used to cause the tensile stress in metal layer 605 to form fracture 702 in substrate 601, separating base layer 701 from substrate 601. Base layer 601 comprises the same material as substrate 601, and may be less than about 20 μm thick in some embodiments. The thickness of the base layer 701 is determined by the tensile stress and thickness of metal layer 605. Intrinsic layer 602, optional BSF 603 (in embodiments comprising optional BSF 603), and a-Si layer 604 are spalled from substrate 601 along with base layer 701. In block 504, flexible substrate layer 606 is removed from metal layer 605.

Figure 8:
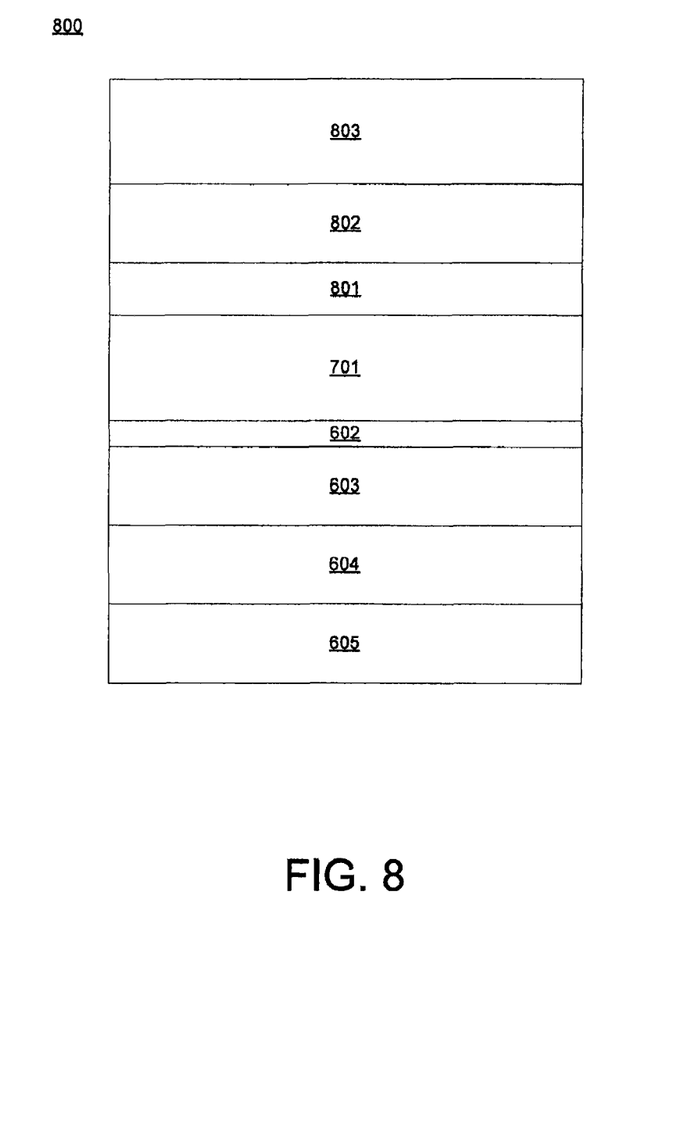
FIG. 8 illustrates an embodiment of a double heterojunction III-V PV cell.

In block 505, a double HJ III-V PV cell 800 is formed using base layer 701, as shown in FIG. 8. Double HJ III-V cell 800 comprises optional BSF 603; however, in some embodiments, intrinsic layer 602 may be located directly on a-Si layer 604, and optional BSF 603 may be absent. Metal layer 605 may comprise a back contact for the single HJ II-IV cell 800. Intrinsic layer 801 is formed on base layer 701, a-Si layer 802 is formed on intrinsic layer 801, and TCO layer 803 is formed on amorphous silicon layer 802. The a-Si layer 802 may comprise a doping type (n-type or p-type) that is opposite the doping type of substrate 601; in such an embodiment, a-Si layer 802 may act as an emitter for double HJ III-IV cell 800. TCO layer 803 may comprise zinc oxide (ZnO) doped with aluminum (Al) in some embodiments. Finger or bus bars (not shown) may be formed on TCO layer 803 in some embodiments.

While some embodiments of double HJ III-V PV cell 800 may comprise a base layer 701 formed by spalling, other embodiments of cell 800 may comprise a base layer 701 formed by epitaxial layer transfer. In embodiments using epitaxial layer transfer to form base layer 701, a sacrificial layer is formed in the substrate 601, then intrinsic layer 602, optional BSF 603, and a-Si layer 604 are formed on substrate 601. The base layer 701, intrinsic layer 602, optional BSF 203, and a-Si layer 604 are separated from the substrate 601 at the sacrificial layer. A double HJ III-V cell 800 may then be formed using base layer 701, intrinsic layer 602, optional BSF 203, and a-Si layer 604 in the same manner discussed above with respect to block 505.

The technical effects and benefits of exemplary embodiments include formation of a lightweight, flexible solar cell.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for forming a heterojunction III-V photovoltaic (PV) cell, the method comprising:
    forming a first intrinsic layer on a substrate;
    forming a first back surface field layer on the first intrinsic layer;
    forming a first amorphous silicon layer on the first back surface field layer;
    performing a layer transfer of a base layer from the substrate, the base layer having a thickness of less than about 20 microns, wherein the layer transfer comprises spalling, and wherein spalling comprises:
        forming a metal layer having a tensile stress on the first amorphous silicon layer;
        adhering a flexible substrate to the metal layer;
        using the tensile stress in the metal layer to cause a fracture in the wafer below the base layer, wherein a location of the fracture and the thickness of the base layer are determined by the tensile stress and a thickness of the metal layer; and
        removing the flexible substrate from the metal layer;
    forming a second-intrinsic layer on the base layer;
    forming a second-amorphous silicon layer on the second intrinsic layer; and
    forming a transparent conducting oxide layer on the second amorphous silicon layer.

2. The method of claim 1, wherein the layer transfer comprises smart cut, and wherein smart cut comprises:
    performing hydrogen implantation in the wafer below the base layer; and
    annealing the wafer to initiate a fracture below the base layer.

3. The method of claim 1, wherein the layer transfer comprises epitaxial layer transfer, and wherein epitaxial layer transfer comprises:
    forming a sacrificial layer in the wafer below the base layer; and
    using a wet chemical etch of the sacrificial layer to remove the base layer from the wafer.

4. The method of claim 1, wherein the metal layer comprises nickel.

5. The method of claim 1, wherein the flexible substrate comprises a material having a radius of curvature of less than 5 meters.

6. The method of claim 1, further comprising forming a second back surface field on the substrate before performing layer transfer, wherein the second back surface field comprises at least one of zinc, indium, and wherein the second back surface field is layer transferred from the substrate with the base layer.

7. The method of claim 1, wherein the first amorphous silicon layer comprises a doping type that is opposite a doping type of the substrate, and the first amorphous silicon layer is configured to act as an emitter.

8. The method of claim 1, wherein the second amorphous silicon layer comprises a doping type that is the opposite to a doping type of the substrate, and the second amorphous silicon layer is configured to act as an emitter.

9. The method of claim 1, wherein the substrate comprises one of germanium or gallium arsenide.

\* \* \* \* \*